(12) United States Patent
Reents et al.

(10) Patent No.: US 10,503,477 B2
(45) Date of Patent: Dec. 10, 2019

(54) GALOIS FIELD PIPELINED MULTIPLIER WITH POLYNOMIAL AND BETA INPUT PASSING SCHEME

(71) Applicant: EXTEN Technologies, Inc., Austin, TX (US)

(72) Inventors: Daniel B. Reents, Dripping Springs, TX (US); Ashwin Kamath, Cedar Park, TX (US)

(73) Assignee: EXTEN TECHNOLOGIES, INC., Austin, TX (US)

( * ) Notice: Subject to any disclaimer, the term of this patent is extended or adjusted under 35 U.S.C. 154(b) by 0 days.

(21) Appl. No.: 15/836,491

(22) Filed: Dec. 8, 2017

(65) Prior Publication Data

US 2019/0179617 A1 Jun. 13, 2019

(51) Int. Cl.
*G06F 7/72* (2006.01)
*G06F 11/10* (2006.01)
*H03M 13/00* (2006.01)

(52) U.S. Cl.
CPC .......... *G06F 7/724* (2013.01); *G06F 11/1076* (2013.01); *H03M 13/6516* (2013.01); *G06F 2211/1057* (2013.01)

(58) Field of Classification Search
CPC . G06F 7/724; G06F 11/1076; H03M 13/6516
USPC ................... 708/523–524, 620–632
See application file for complete search history.

(56) References Cited

U.S. PATENT DOCUMENTS

| | | | | |
|---|---|---|---|---|
| 8,615,541 | B2* | 12/2013 | Johnson | G06F 7/38 708/495 |
| 9,959,247 | B1* | 5/2018 | Woo | G06F 7/76 |
| 2009/0254333 | A1* | 10/2009 | Alt | G06F 7/584 703/23 |
| 2016/0112069 | A1* | 4/2016 | Lablans | H03M 13/15 714/752 |

* cited by examiner

*Primary Examiner* — Tan V Mai
(74) *Attorney, Agent, or Firm* — Sprinkle IP Law Group

(57) ABSTRACT

The disclosure provides a very flexible mechanism for a storage controller to create RAID stripes and to re-create corrupted stripes when necessary using the erasure coding scheme. Typically, this is known as a RAID 6 implementation/feature. The erasure code calculations are generated using the Galois Multiplication hardware and the system controller can pass any polynomial into the hardware on a per stripe calculation basis. The polynomial value is passed to the hardware via an input descriptor field. The descriptor controls the entire computation process.

13 Claims, 2 Drawing Sheets

GALOIS FIELD PIPELINED MULTIPLIER WITH POLYNOMIAL AND BETA INPUT PASSING SCHEME

TECHNICAL FIELD

The subject disclosure relates generally to computer hardware and software design. In particular, the subject disclosure relates to redundant array of independent disks (RAID) controllers supporting RAID 6.

BACKGROUND

The concept of a redundant array of independent disks (RAID) in a storage array is based on the notion that if data is spread along multiple disks, and one of those disks fails, then the data in that disk can be recovered. There are different types of RAIDs. RAID 5 is based on the loss of a single disk drive. For example, if there are five disk drives, and four data stripes, and one RAID stripe, and any one of those five disks fail, then the data from the failed disk can be recovered from the other four. This would only require an XOR function, and does not have a multiplier.

However, in using RAID 6, there is an ability to recover two failed disk drives. For example, if there are six disk drives with the data spread among four disk drives, and one was the XOR drive, and another drive was the multiplier drive, then out of that group of six drives, one or two drives can be recovered. That's why a multiplier is required for this functionality. This is also sometimes called erasure coding.

SUMMARY OF THE SUBJECT DISCLOSURE

The present subject disclosure presents a hardware mechanism by which a unique polynomial and beta value can be passed to a deeply pipelined Galois field multiplier engine.

In one exemplary embodiment, the present subject matter is a method for performing a computation on a multiplier. The method includes receiving a descriptor, wherein the descriptor includes a polynomial select value and a beta value; producing a calculation based on the polynomial select value and the beta value; and outputting a result from the calculation to an external memory.

In another exemplary embodiment, the present subject matter is a method for performing a computation on a multiplier. The method includes receiving a descriptor, wherein the descriptor includes all of the information that is required by the multiplier to fully execute the requested operation, including a polynomial select value and a multiplier constant; producing a calculation based on the polynomial select value and the multiplier constant, and wherein the polynomial select value is eight; and outputting a result from the calculation to an external memory.

In yet another exemplary embodiment, the present subject matter is a system for performing a computation on a multiplier. The system includes a load pointer to direct a 8-bit data in bus to a correct multiplier block in a round robin fashion; a series of multipliers that produces a series of 8 bit results; and a result pointer that selects an individual 8 bit multiplier result for presentation on an output bus.

BRIEF DESCRIPTION OF THE DRAWINGS

Various exemplary embodiments of this disclosure will be described in detail, wherein like reference numerals refer to identical or similar components or steps, with reference to the following figures, wherein.

DETAILED DESCRIPTION

Figure 1:
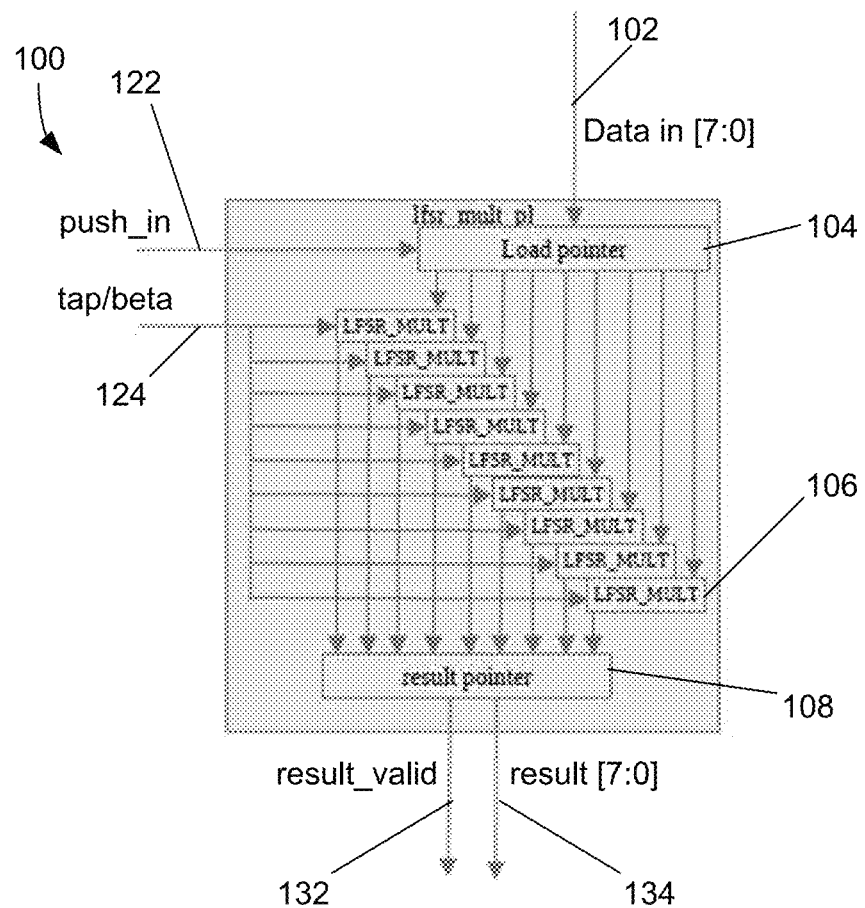
FIG. 1 illustrates a multiplier, according to an exemplary embodiment of the present subject disclosure.

The present subject disclosure provides a very flexible mechanism for a storage controller to create RAID stripes and to re-create corrupted stripes when necessary using the erasure coding scheme. Typically, this is known as a RAID 6 implementation/feature. The erasure code calculations are generated using the Galois Multiplication hardware and the system controller can pass any polynomial into the hardware on a per stripe calculation basis. The polynomial value is passed to the hardware via an input descriptor field. The descriptor controls the entire computation process.

In order to fully understand the present subject matter, one of ordinary skill in the art would have to have a basic understanding of RAID 6, erasure coding, Galois multiplication, and linear feedback shift register (LFSR) operation.

There are many novel aspects of the mechanism discussed according to the present subject disclosure. Some non-limiting examples include, but are not limited to: descriptor based interface controlling all aspects of the calculations; heavily pipe-lined design with very low latency overhead; fully flexible design allowing the client to utilize any polynomial and beta value.

The multiplier hardware consists of (9×32=288) 8-bit, finite field polynomial multipliers implemented utilizing a Linear Feedback Shift Register (LFSR). This hardware can also be referred to as a Galois Field (GF($2^m$)) Multiplier, where m is the degree of the polynomial (or LFSR hardware tap select) and beta=the incoming data stream is multiplied by this value.

The 8-bit multiplier hardware design is based in part on the paper entitled: "Finite Field Polynomial Multiplier with Linear Feedback Shift Register" (Che-Wun Chiou, Chiou-Yng Lee, Jim-Min Lin), which is incorporated by reference herein in its entirety into this disclosure. The substance of the paper will not be repeated here for sake of brevity.

The 8 bit multipliers are implemented in a 9 instance deep×32 instance wide arrangement to allow the multiplication operation to be performed on an ×256 bit wide input data stream and to efficiently support streaming data input patterns. A 9 clock delay exists from the start of computation to the result being valid. If the input data stream is constantly valid through the entire operation, the 9 clock latency will only be observed at the beginning of the transaction.

As mentioned above, each time a computation is required, the multiplier hardware is given a descriptor from the system. This descriptor is referred to as the XORH (XOR Header). Two fields in the XORH are provided that define the polynomial/tap select value and the multiplier (or beta) value for each operation. These fields are explained in further detail below.

A first field is the polynomial/tap select. This field defines the polynomial that is used by the multiplier logic. More specifically, this field selects the LFSR "tap" positions of the multiplier circuit. Note that the degree of the polynomial, and therefore, the width of the multiplier circuit, is always assumed to be 8. This field is 8 bits wide and bit positions 7 and 0 are don't care.

For example, assume that the desired polynomial, of degree 8, for a given computation is $x^8+x^4+x^3+x^2+1$.

Then the proper value for the polynomial/tap select field would be 0x1C thus selecting an XOR "tap" to drive LFSR bit positions 4, 3, and 2.

A second field is the multiplier constant (beta). This field defines the 8 bit constant value that is to be multiplied by each incoming byte of the input data stream.

The present machine resides in an IRAY node, which is a type of node that doesn't have a microprocessor, and just the present multiplier (I/O machine). The node receives a descriptor, which contains address, length for the data, the source data, the P buffer, and the Q buffer. It also contains the m value and the beta value. The machine goes out and fetches the data, includes its m and beta values, does its calculations, and then produces the data which it sends out to the external memory.

Thus, one of the abilities of the present subject disclosure is to control the operation of the multiplier by use of the descriptor. This subject matter is most applicable to RAID 6 because it has an XOR multiplier within it.

FIG. 1 illustrates an exemplary embodiment of a single, 8-bit, multiplier pipe-line arrangement (Ifsr_mult_pl module). Thus, once a result is received at 8 bits, there will be a result at every bit. The module consists of 9 instances of the 8-bit finite field polynomial multipliers 106. The load pointer 104 simply directs the 8 bit "data in" 102 bus to the correct multiplier block 106 in a round robin fashion and the result pointer 108 selects the individual 8 bit multiplier result for presentation on the "result" output bus 134. Each set of 8 bits goes to a different multiplier. Each LFSR multiplier 106 is given a tap and a beta 124. For every operation, the tap value and the beta from the descriptor and applied to the circuit, and kept constant through the operation. The data in may be large (4 k) so the tap and beta value are kept constant. The push_in 122 is the data qualifying signal for the data in. Every time data is inserted in, there is a push_in 122. The tap/beta 124 are two values that are constant throughout the multiplication operation. These data are constant for the input data stream that is being multiplied. The tap is the polynomial selection for the tap selection. Beta is the value that the data is multiplied by. The result_valid 132 is the qualifier for the result. The result [7:0] 134 places the data to the next stage.

Figure 2:
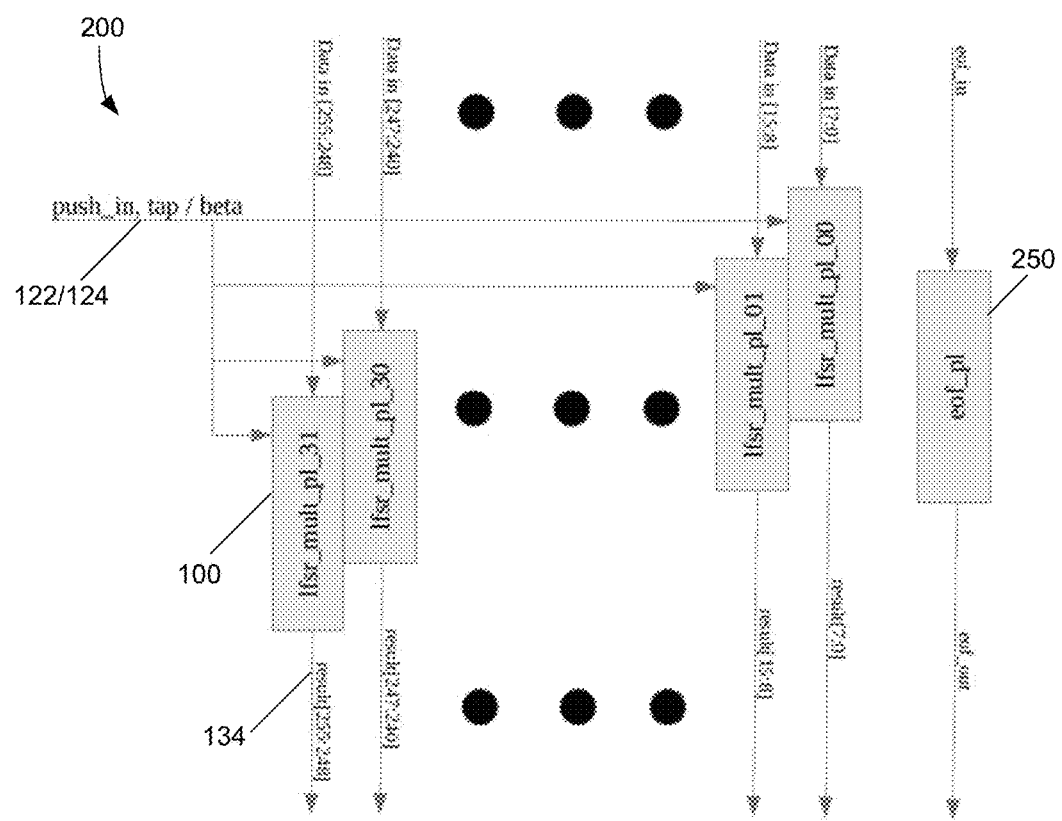
FIG. 2 illustrates a series of multipliers, according to an exemplary embodiment of the present subject disclosure.

As shown in FIG. 2, thirty two (32) of the Ifsr_mult_pl modules are instantiated to create a full ×256 bit wide multiplier circuit as shown. FIG. 2 is essentially a series of multipliers in parallel from FIG. 1. Note that the EOF (end of frame) flag handling is a completely side-band operation and is present only to assist the overall sequencing logic with tracking the input stream. Each of the boxes 100 shown in this figure is the equivalent of one of the 8 bit multipliers shown in FIG. 1. There are 32 boxes in order to multiply a 32 byte wide value because that's how wide the data is. This figure shows how to go from an 8 bit multiplier to a 256 bit multiplier. The end of frame data 250 process is shown on the right. When there is a stream of data with multiple beats on a bus, the framing mechanism 250 is used to determine when it starts and when it ends. If, for example, there is a data that is 64 bytes wide, there will be two beats of data, the first 32 bytes, and the second 32 bytes. By using an end of frame (eof) indicator 250, the downstream logic is informed as to where the stream begins and when it ends. This is called framing the stream of data. The eof 250 has to be kept in sync with the result out 134.

The subject matter described herein may be used in a variety of preferred ways, including, for example: (a) generation of a module level description of the mechanism; (b) low level, micro-architecture document showing block level flow diagrams for the implementation; (c) generation of Verilog RTL to implement the design; (d) block level simulation to verify the design and modify any issues found; (e) bring up and testing utilizing a hardware emulation platform; (f) integration into the top level design; (g) system level simulation; (h) standard back-end ASIC development process to produce the targeted device. Other variations are also possible.

Alternate uses of the subject disclosure are also within the scope of the present disclosure. For example, the present subject disclosure may easily be expanded or reduced to operate on an input data stream of almost any width.

The examples and methods described above are not limited to software or hardware, but may be either or a combination of both. If software, the method described is presented as code in a software program. If hardware, a processor is used to conduct the steps which are embedded within the hardware. The subject matter may also be a combination of software and hardware with one or more steps being embedded within a hardware component, and the other steps being part of a software program.

The illustrations and examples provided herein are for explanatory purposes and are not intended to limit the scope of the appended claims. It will be recognized by those skilled in the art that changes or modifications may be made to the above described embodiment without departing from the broad inventive concepts of the subject disclosure. It is understood therefore that the subject disclosure is not limited to the particular embodiment which is described, but is intended to cover all modifications and changes within the scope and spirit of the subject disclosure.

What is claimed is:

1. A system for performing a computation on a multiplier, comprising:
    a load pointer to direct a 8-bit data in bus to a correct multiplier block of a series of multipliers in a round robin fashion;
    the series of multipliers adapted to produce a series of 8 bit results, wherein the correct multiplier block is adapted to produce an individual 8 bit multiplier result based on the 8-bit data in bus; and
    a result pointer that selects the individual 8 bit multiplier result from the correct multiplier block result for presentation on an output bus.

2. The system of claim 1, wherein the series of multipliers includes a plurality of multipliers in parallel with each other.

3. The system of claim 1, wherein the series of multipliers use a polynomial select value and a beta value.

4. The system of claim 3, wherein the system is adapted to receive a descriptor.

5. The system of claim 4, wherein the descriptor includes a polynomial select value and a beta value.

6. The system of claim 5, wherein the beta value define an 8-bit constant value to be multiplied by the 8-bit data.

7. The system of claim 6, wherein the descriptor includes a source of the 8-bit data.

8. The system of claim 7, wherein the descriptor includes a P buffer.

9. The system of claim 8, wherein the descriptor includes a Q buffer.

10. The system of claim 1, wherein the series of multipliers is a Galois Field multiplier.

11. The system of claim 10, wherein the series of multipliers uses a Linear Feedback Shift Register.

12. The system of claim 11, wherein the series of multipliers are implemented in a 9 instance deep×32 instance wide arrangement.

13. The system of claim 1, wherein the system resides in an IRAY node.

\* \* \* \* \*